United States Patent [19]

Terashima

[11] Patent Number: 5,270,568
[45] Date of Patent: Dec. 14, 1993

[54] STRUCTURE FOR PREVENTING ELECTRIC FIELD CONCENTRATION IN SEMICONDUCTOR DEVICE

[75] Inventor: Tomohide Terashima, Fukuoka, Japan

[73] Assignee: Mitsubishi Denki Kabushiki Kaisha, Tokyo, Japan

[21] Appl. No.: 709,988

[22] Filed: Jun. 4, 1991

[30] Foreign Application Priority Data

Jun. 12, 1990 [JP] Japan .................................. 2-154620

[51] Int. Cl.$^5$ ...................... H01L 29/34; H01L 29/40
[52] U.S. Cl. .................................. 257/487; 257/488; 257/490; 257/495
[58] Field of Search ..................... 357/52, 53; 257/487, 257/488, 490, 495

[56] References Cited

U.S. PATENT DOCUMENTS 4,707,719 11/1987 Whight .............................. 357/53
5,068,756 11/1991 Morris et al. ..................... 357/34

FOREIGN PATENT DOCUMENTS 59-144171 8/1984 Japan ................................. 357/53

OTHER PUBLICATIONS

Martin, Russel A. et al, "850V NMOS Driver with Active Outputs", 1984, pp. 266-269.

Primary Examiner—J. Carroll
Attorney, Agent, or Firm—Oblon, Spivak, McClelland, Maier & Neustadt

[57] ABSTRACT

Conductive plates (16a-16e), or floating semiconductor regions (17a-17d), or conductive plates (16a, 16c, 16e) and floating semiconductor regions (17a, 17d) are disposed in alignment so that a coupling capacitance between the conductive plates and/or the floating semiconductor regions which are adjacent to each other decrease as a distance from a first or second semiconductor region (12, 13) increases. Therefore, the respective potentials at the conductive plates or the floating semiconductor regions can be varied linearly (or at equal potential differences), and corresponding potential distribution can be achieved on the surface of a semiconductor substrate (11). As a result, electric field concentration on the surface of the semiconductor substrate (11) just under a high potential conductive layer (14) can be prevented effectively even by the use of an insulating layer (15) with a common thickness.

20 Claims, 15 Drawing Sheets

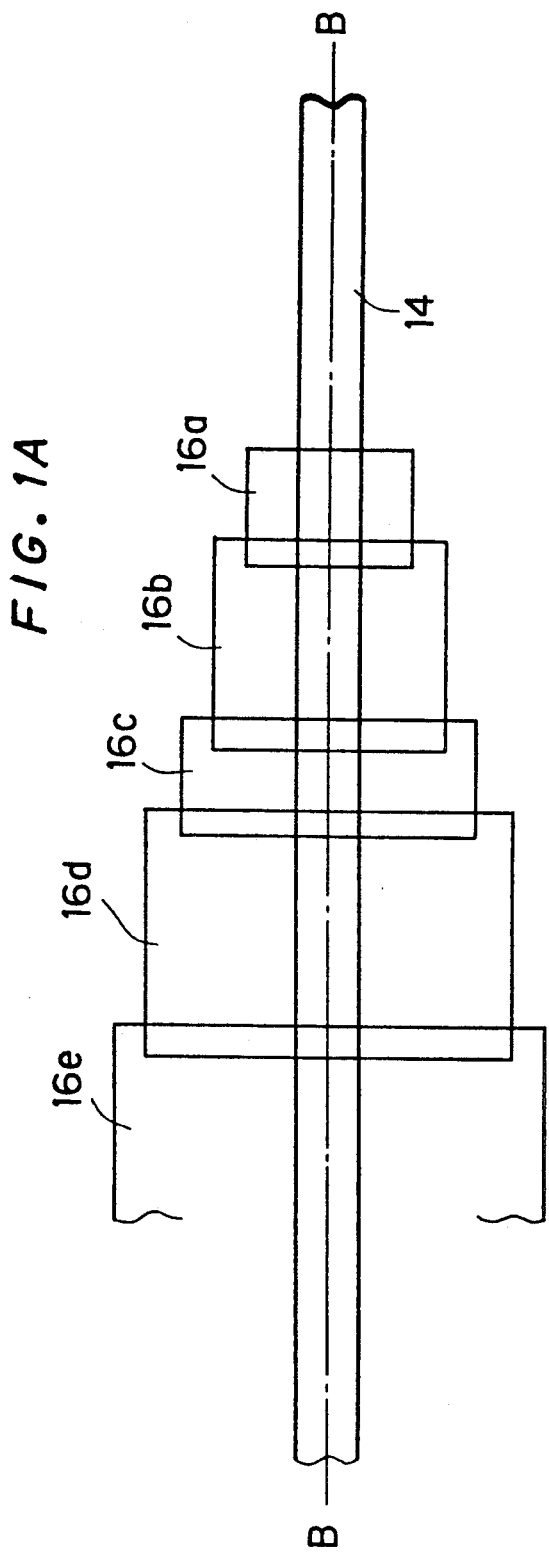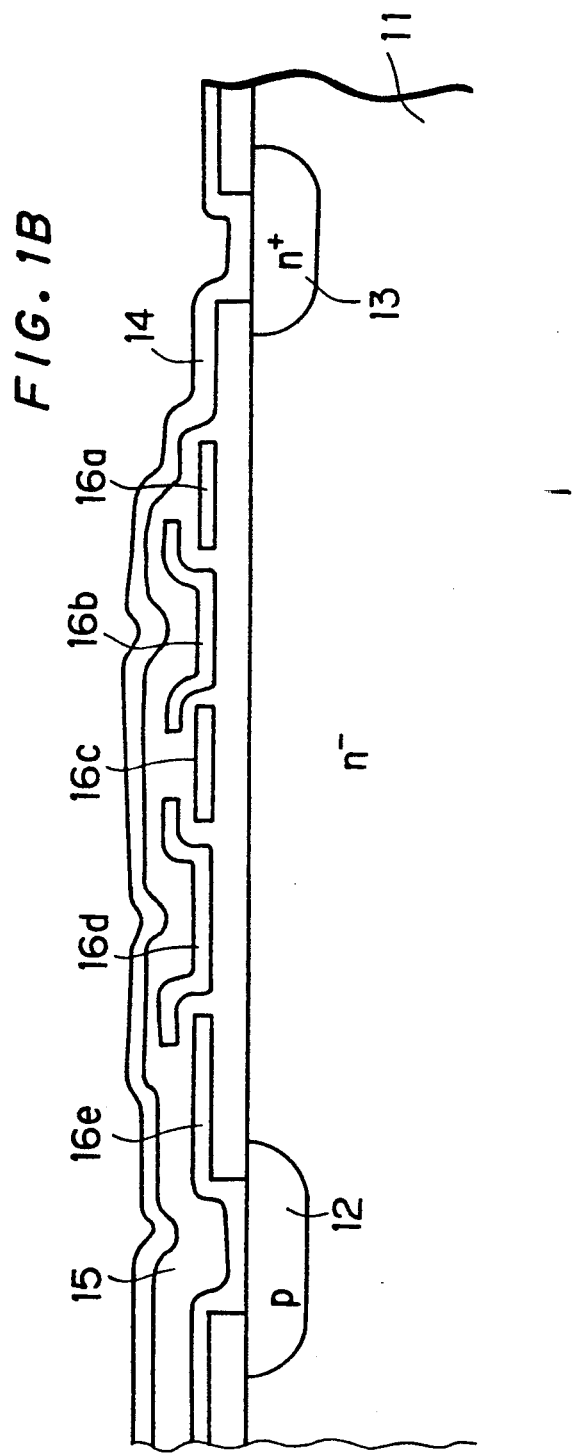

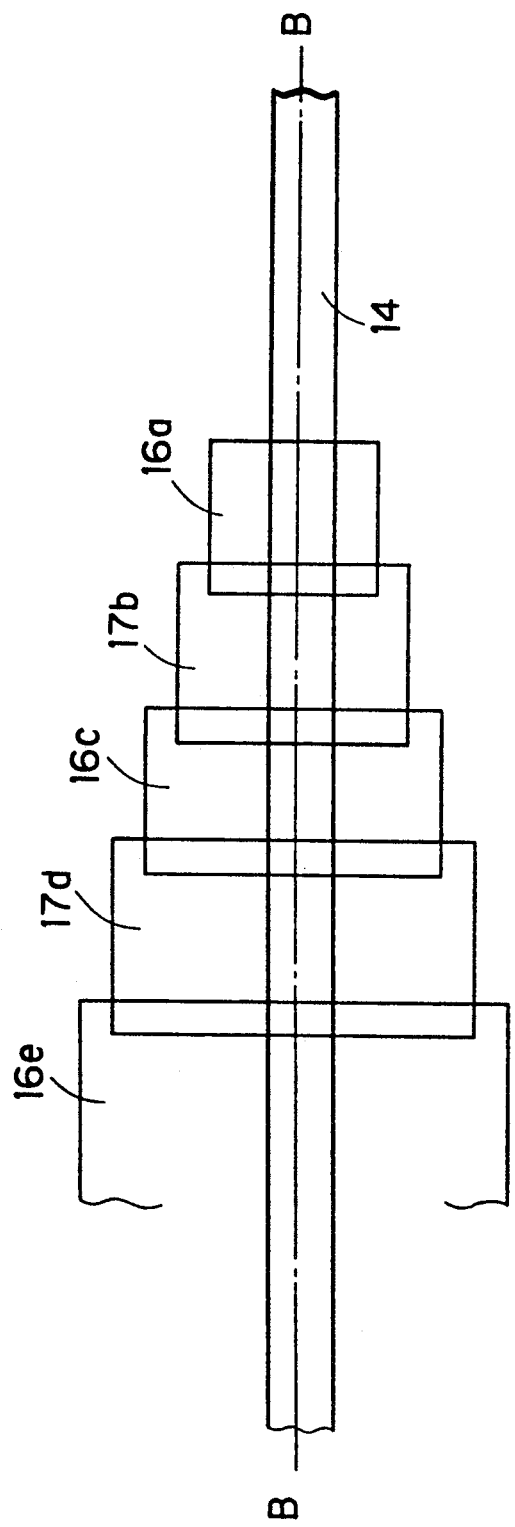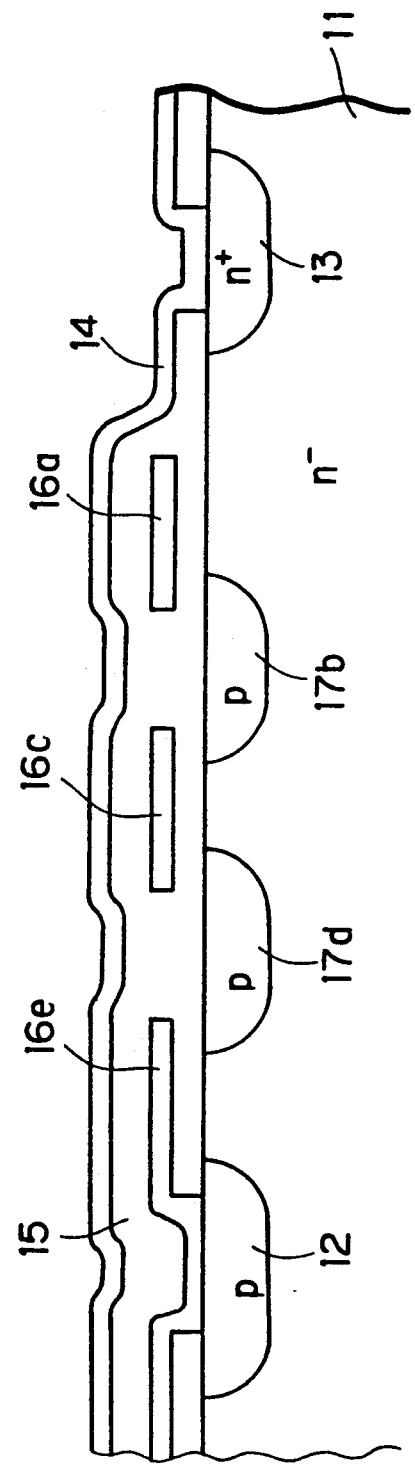

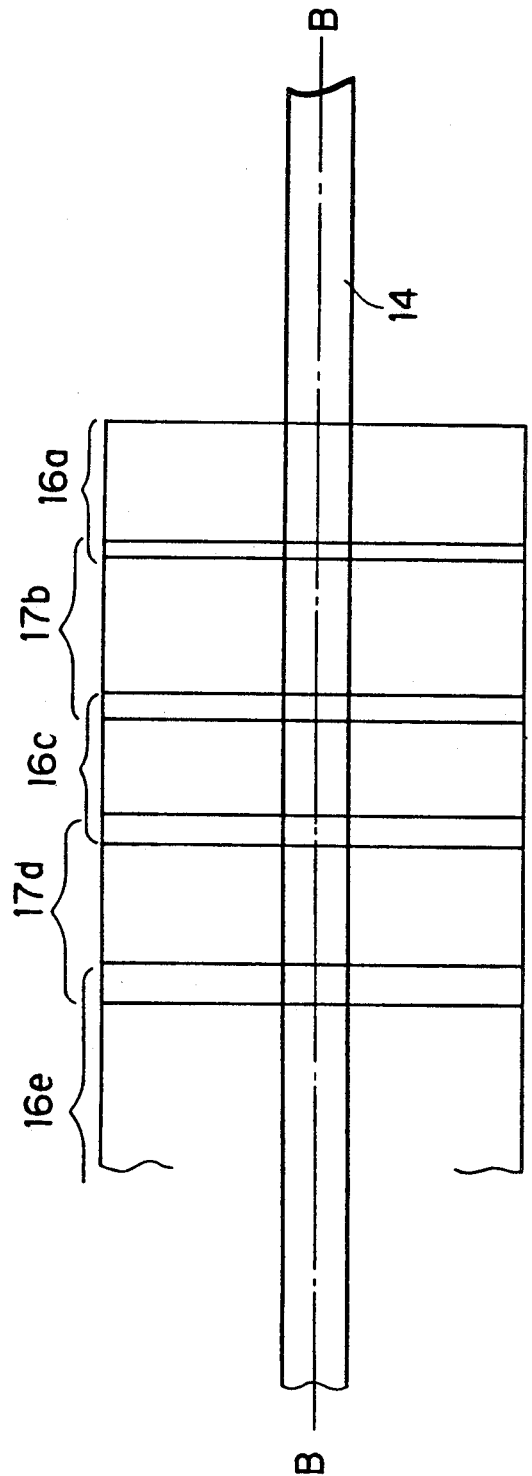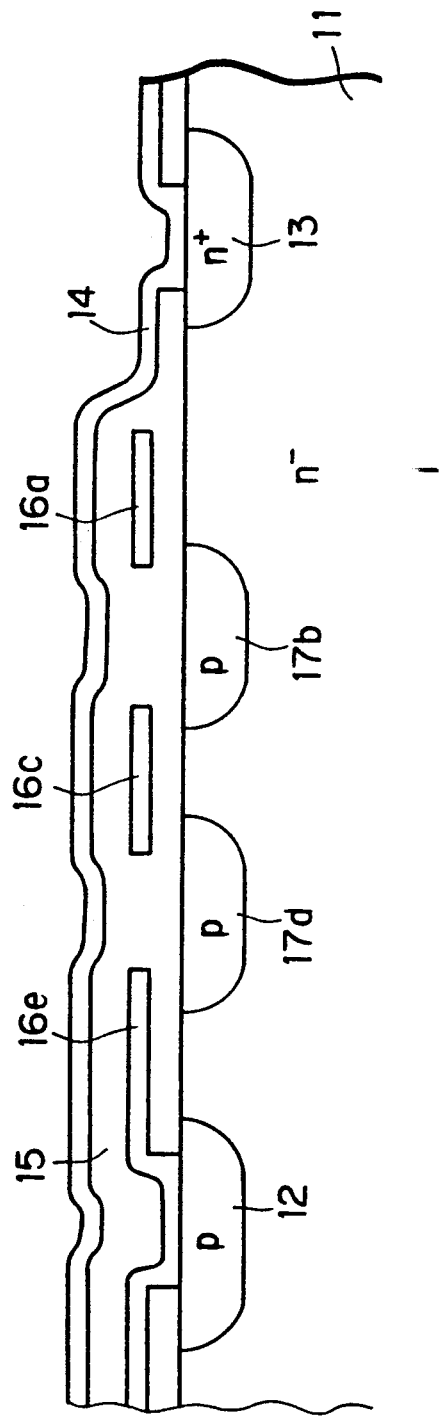

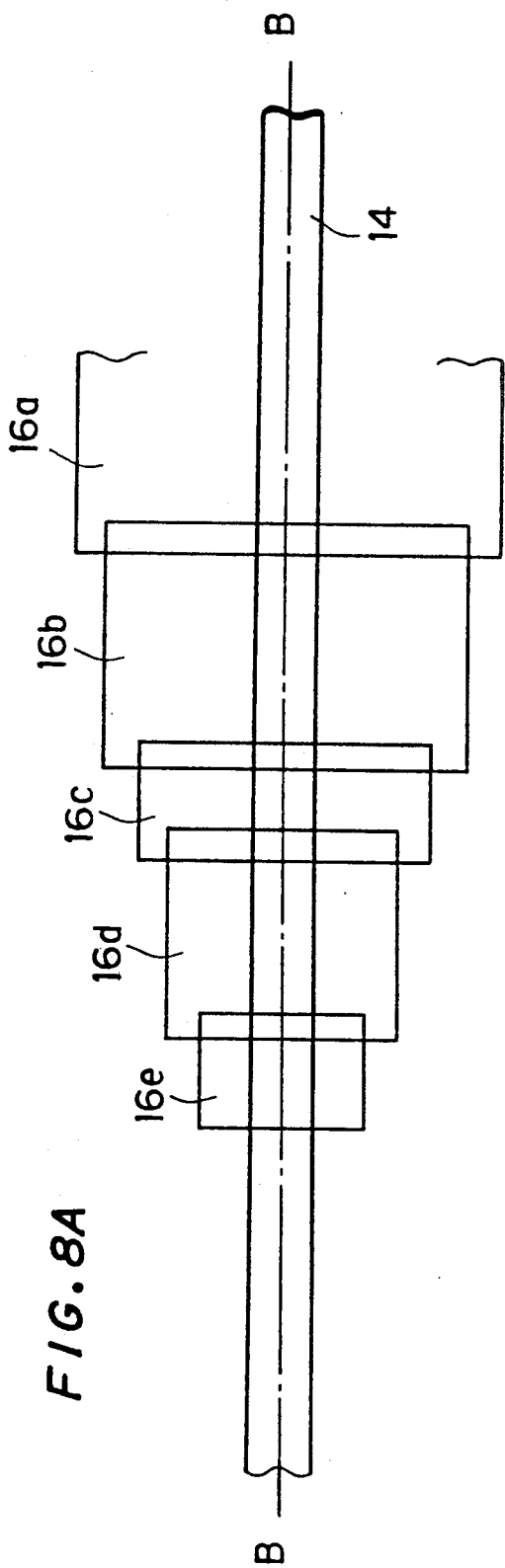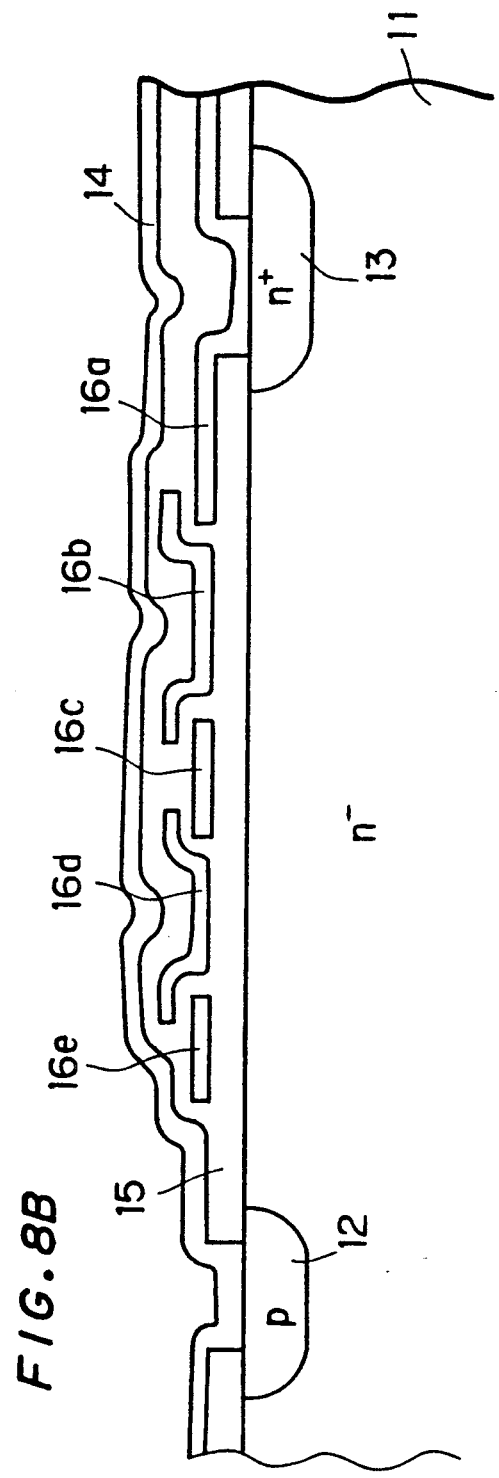
FIG. 8A
FIG. 8B

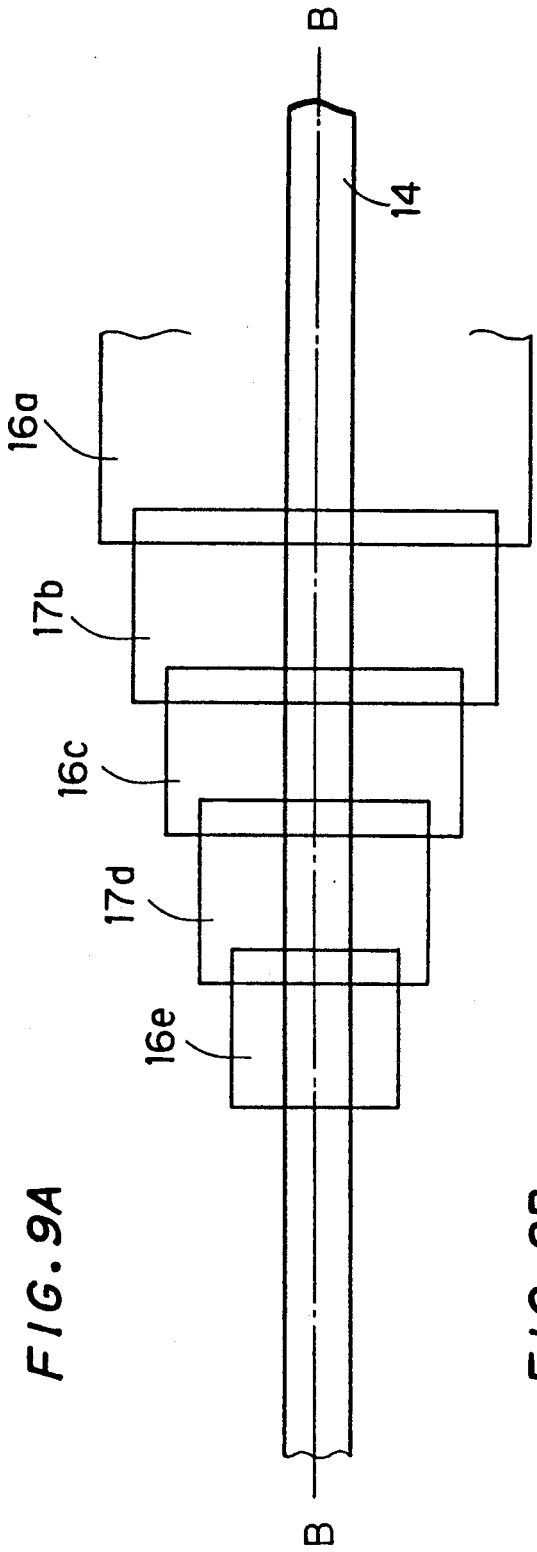
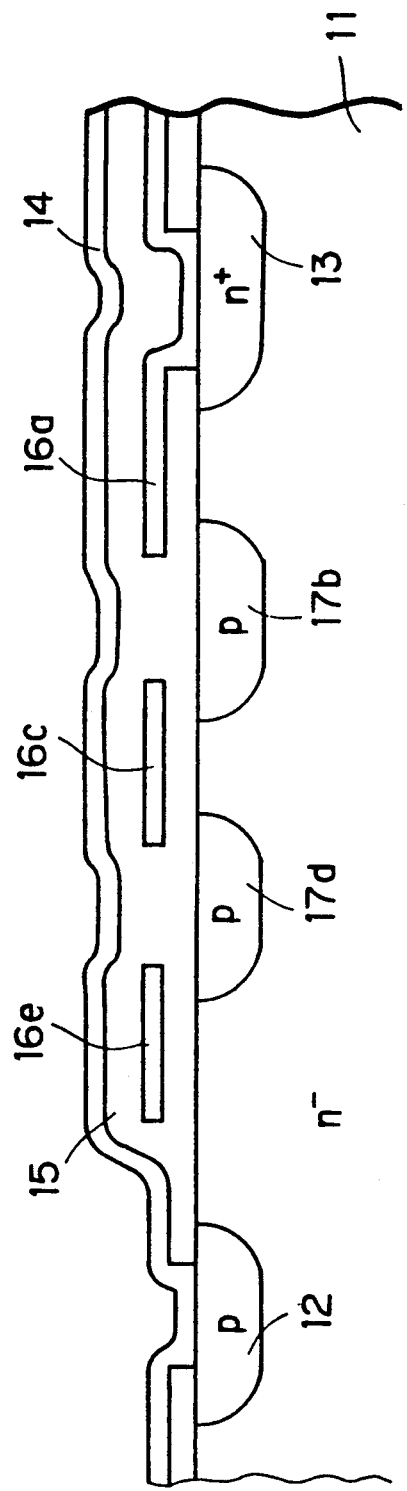
FIG. 9A
FIG. 9B

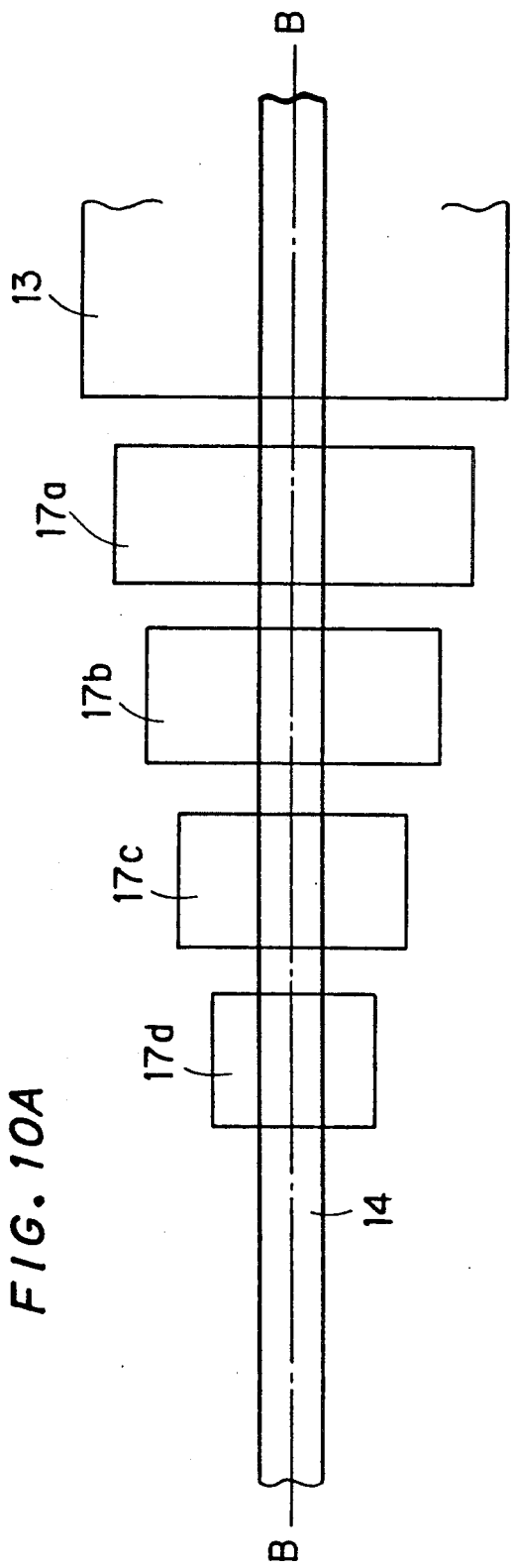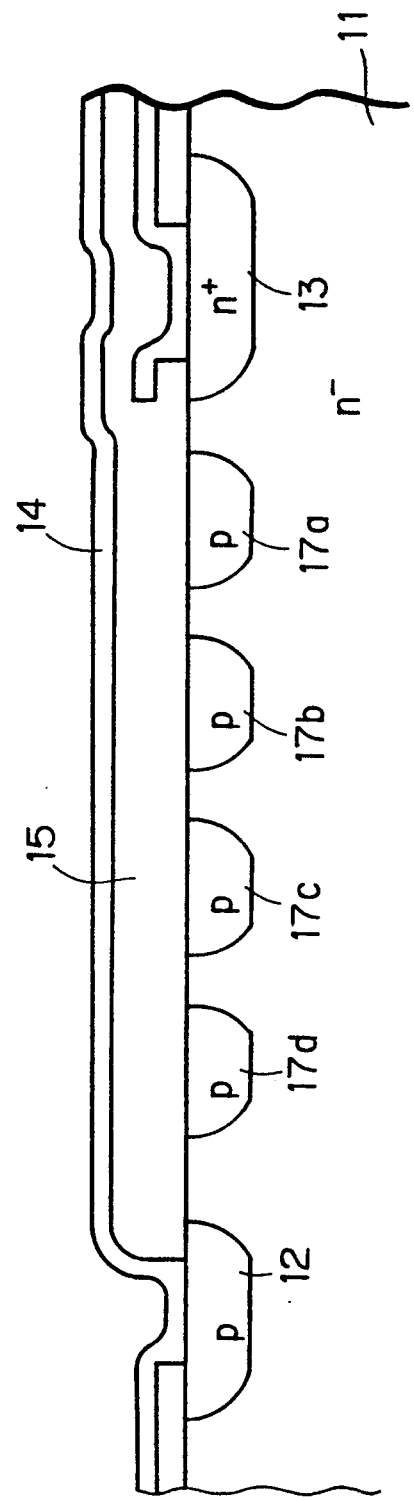
FIG. 10A
FIG. 10B

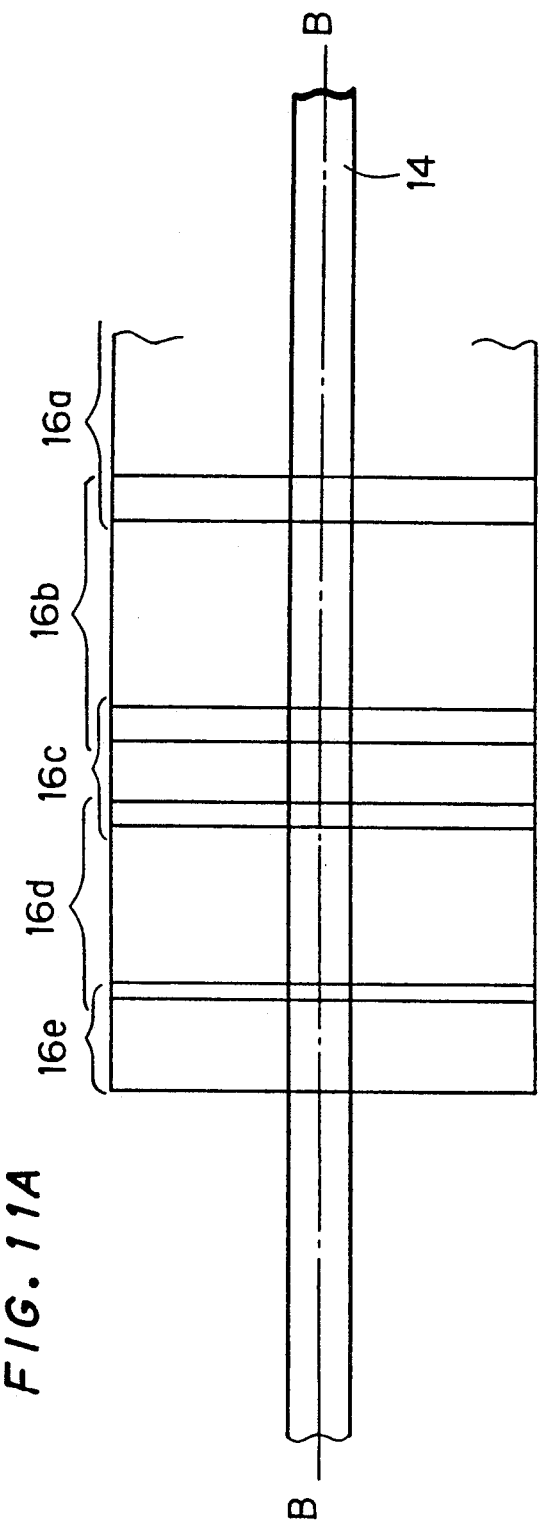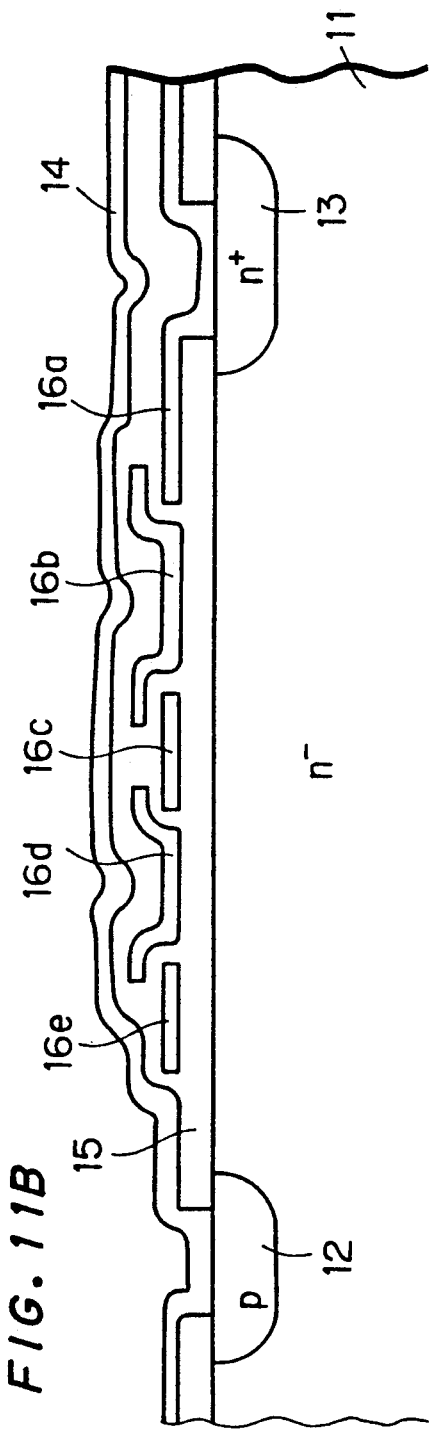
FIG. 11A
FIG. 11B

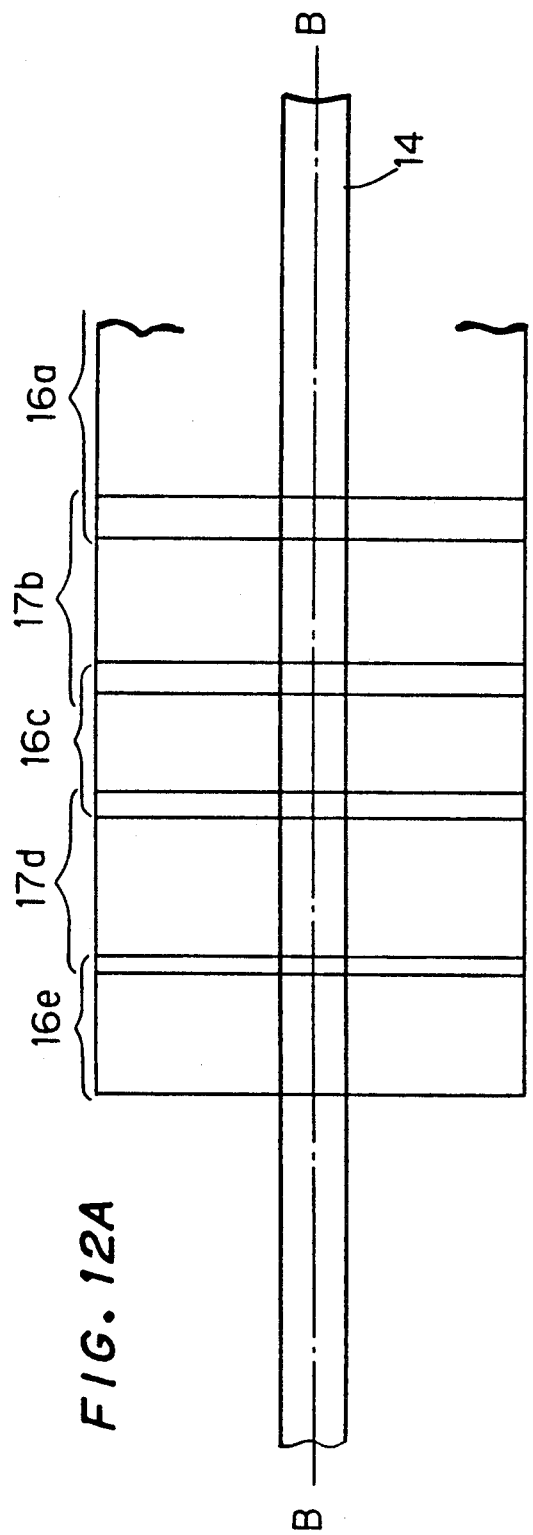
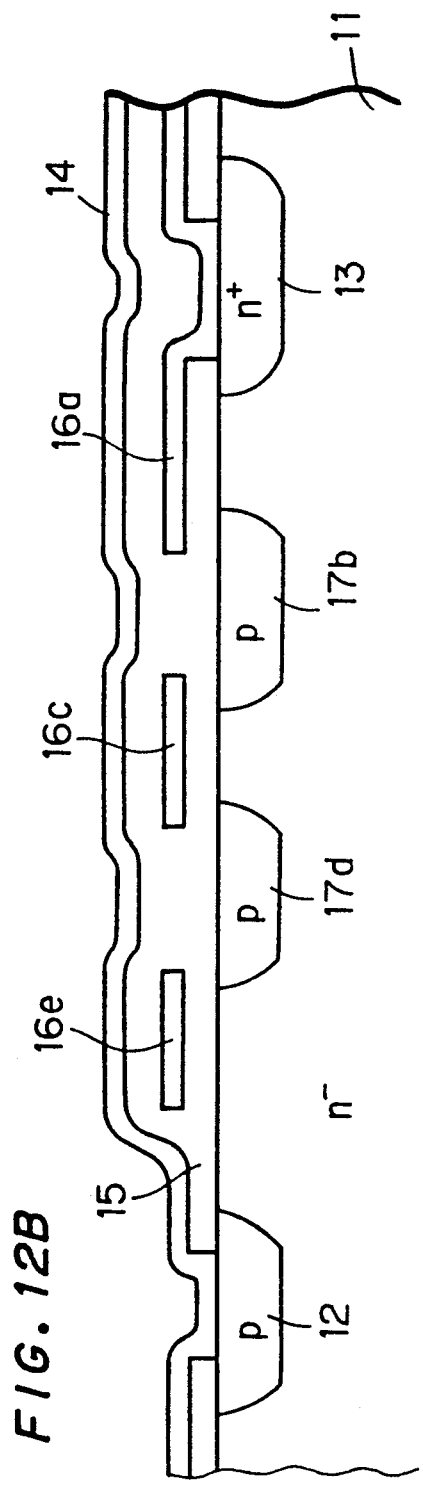
FIG. 12A
FIG. 12B

STRUCTURE FOR PREVENTING ELECTRIC FIELD CONCENTRATION IN SEMICONDUCTOR DEVICE

BACKGROUND OF THE INVENTION

1. Field of the Invention

The present invention relates to a structure for preventing electric field concentration to prevent the influence of an electric field from a conductive layer such as wiring provided on the surface of a semiconductor device from causing the electric field concentration on the surface of a semiconductor layer formed under the conductive layer.

2. Description of the Prior Art

FIGS. 13A and 13B are plan and cross-sectional views showing a structure for preventing electric field concentration in a conventional semiconductor device, respectively. The cross-sectional view of FIG. 13B is taken along the line A—A of the plan view of FIG. 13A.

As shown in FIG. 13B, on the surface of an n⁻ semiconductor substrate 1 are formed a p diffusion region 2 and an n+ diffusion region 3 at a distance. A conductive layer 4 such as wiring is in contact with the n+ diffusion region 3 and is insulated from the n⁻ semiconductor substrate 1 and the p diffusion region 2 by an insulating layer 5. In the insulating layer 5 formed immediately under the conductive layer 4, conductive plates 6a-6e are disposed in alignment. The leftmost conductive plate 6e is contacted by the p diffusion region 2, and the other conductive plates 6a-6d are held floatingly in the insulating layer 5. The edges of the adjacent conductive plates overlap each other.

The conductive plates 6a and 6b, 6b and 6c, 6c and 6d, and 6d and 6e are capacitively coupled respectively. The conductive layer 4 and the respective conductive plates 6a-6e are also capacitively coupled.

When the potential at the p diffusion region 2 is low and the potential at the n+ diffusion region 3 is high, a depletion layer extends from a pn junction interface of the n⁻ semiconductor substrate 1 and the p diffusion region 2. By the depletion of the almost entire n⁻ semiconductor substrate between the p diffusion region 2 and the n+ diffusion region 3, high breakdown voltage is achieved. Dotted lines in FIG. 14 indicate equipotential lines in the depleted region of the n⁻ semiconductor substrate 1 in the case where the conductive layer 4 is absent. Since the depletion layer can extend laterally without restriction on the surface of the n⁻ semiconductor substrate 1, electric field concentration does not occur on the surface of the n⁻ semiconductor substrate 1.

On the other hand, when the conductive layer 4 having a high potential is present, the lateral extension of the depletion layer on the surface of the n⁻ semiconductor substrate 1 is restrained by the influence of an electric field from the conductive layer 4 if there are not the conductive plates 6a-6e. The equipotential lines in the depleted region of the n⁻ semiconductor substrate 1 are indicated by dotted lines in FIG. 15. The electric field concentration occurs on the surface of the n⁻ semiconductor substrate 1 and the breakdown voltage is deteriorated. In order to prevent the above occurrence, the conductive plates 6a-6e are provided.

Provided that coupling capacitances between the conductive plates 6a-6e and between the conductive layer 4 and the conductive plate 6a are sufficiently larger than coupling capacitances between the conductive layer 4 and the conductive plates 6b-6e, the respective potentials at the conductive plates 6a-6e ascend in order from the conductive plate 6e toward the conductive plate 6a according to the capacitance division of potential differences between the p diffusion region 2 and the n+ diffusion region 3. Thus, the depletion layer extends easily rightward (on the n+ diffusion region 3 side) on the surface of the n⁻ semiconductor substrate 1, and the electric field concentration on the surface of the n⁻ semiconductor substrate 1 is relieved.

According to the structure for preventing electric field concentration in the conventional semiconductor device as above constructed, the coupling capacitances between the conductive plates 6a-6e and between the conductive layer 4 and the conductive plate 6a must be sufficiently larger than the coupling capacitances between the conductive layer 4 and the conductive plates 6b-6e to relieve the electric field concentration on the surface of the n⁻ semiconductor substrate 1 effectively. For the achievement, however, the insulating layer 5 which intervenes between the conductive layer 4 and the conductive plates 6b-6e must be much thicker than insulating layers generally used, and the formation of the insulating layer 5 is difficult. For this reason, the effect of preventing electric field concentration on the surface of the n⁻ semiconductor substrate 1 cannot be sufficiently achieved when the insulating layer 5 with an easily formable thickness is used.

SUMMARY OF THE INVENTION

In the first aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the second semiconductor region, provided extendedly over the first semiconductor region, an insulating layer formed between the conductive layer and the semiconductor layer as well as the first semiconductor region, and a plurality of conductive plates disposed in alignment from a position facing to the first semiconductor region toward the second semiconductor region in the insulating layer just under the conductive layer so that a coupling capacitance between the adjacent conductive plates decreases as a distance from the first semiconductor region increases.

In the second aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the second semiconductor region, provided extendedly over the first semiconductor region, an insulating layer formed between the conductive layer and the semiconductor layer as well as the first semiconductor region, and a plurality of second conductive type floating semiconductor regions disposed in alignment from the vicinity of the first semiconductor region toward the second semiconductor region on the surface of the semiconductor layer just under the conductive layer so that a coupling capacitance between the adjacent floating semiconductor regions decreases as a distance from the first semiconductor region increases.

In the third aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the second semiconductor region, provided extendedly over the first semiconductor region, an insulating layer formed between the conductive layer and the semiconductor layer as well as the first semiconductor region, at least one conductive plate formed in the insulating layer just under the conductive layer, and at least one second conductive type floating semiconductor region formed in the semiconductor layer just under the conductive layer, the conductive plate and the floating semiconductor region being disposed in alignment alternately from the vicinity of the first semiconductor region toward the second semiconductor region so that a coupling capacitance between the conductive layer and the floating semiconductor region which are adjacent to each other decreases as a distance from the first semiconductor region increases.

In the fourth aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the first semiconductor region, provided extendedly over the second semiconductor region, an insulating layer formed between the conductive layer and the semiconductor layer as well as the second semiconductor region, and a plurality of conductive plates disposed in alignment from a position facing to the second semiconductor region toward the first semiconductor region in the insulating layer just under the conductive layer so that a coupling capacitance between the adjacent conductive plates decreases as a distance from the second semiconductor region increases.

In the fifth aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the first semiconductor region, provided extendedly over the second semiconductor region, an insulating layer formed between the conductive layer and the semiconductor layer as well as the second semiconductor region, and a plurality of second conductive type floating semiconductor regions disposed in alignment from the vicinity of the second semiconductor region toward the first semiconductor region on the surface of the semiconductor layer just under the conductive layer so that a coupling capacitance between the adjacent floating semiconductor regions decreases as a distance from the second semiconductor region increases.

In the sixth aspect of the present invention, a structure for preventing electric field concentration in a semiconductor device, comprises a first conductive type semiconductor layer, a second conductive type first semiconductor region formed on the surface of the semiconductor layer, a first conductive type second semiconductor region formed on the surface of the semiconductor layer in isolation from the first semiconductor region, a conductive layer in contact with the surface of the first semiconductor region, provided extendedly over the second semiconductor region, an insulating layer formed between the conductive layer and the semiconductor layer as well as the second semiconductor region, at least one conductive plate formed in the insulating layer just under the conductive layer, and at least one second conductive type floating semiconductor region formed in the semiconductor layer just under the conductive layer, the conductive plate and the floating semiconductor region being disposed in alignment alternately from the vicinity of the second semiconductor region toward the first semiconductor region so that a coupling capacitance between the conductive layer and the floating semiconductor region which are adjacent to each other decreases as a distance from the second semiconductor region increases.

Accordingly, the conductive plates according to the first aspect of the present invention, the floating semiconductor regions according to the second aspect thereof and the conductive plate and the floating semiconductor region according to the third aspect thereof are disposed in alignment so that a coupling capacitance between the conductive plates and/or the floating semiconductor regions which are adjacent to each other decreases as a distance from the first semiconductor region increases. The conductive plates according to the fourth aspect of the present invention, the floating semiconductor regions according to the fifth aspect thereof and the conductive plate and the floating semiconductor region according to the sixth aspect thereof are disposed in alignment so that a coupling capacitance between the conductive plates and/or the floating semiconductor regions which are adjacent to each other decreases as a distance from the second semiconductor region increases. Therefore, the respective potentials at the conductive plates or the floating semiconductor regions can be varied linearly (or at equal potential differences), and corresponding potential distribution can be achieved on the surface of the semiconductor layer. As a result, according to the present invention, the electric field concentration on the surface of the semiconductor layer just under the conductive layer can be prevented effectively even by the use of the insulating layer with a common thickness.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are plan and cross-sectional views showing one preferred embodiment of a structure for preventing electric field concentration according to the present invention respectively;

FIGS. 4A and 4B through 12A and 12B are plan and cross-sectional views showing other preferred embodiments of the structure for preventing electric field concentration according to the present invention respectively;

DESCRIPTION OF THE PREFERRED EMBODIMENTS

Figure 2:
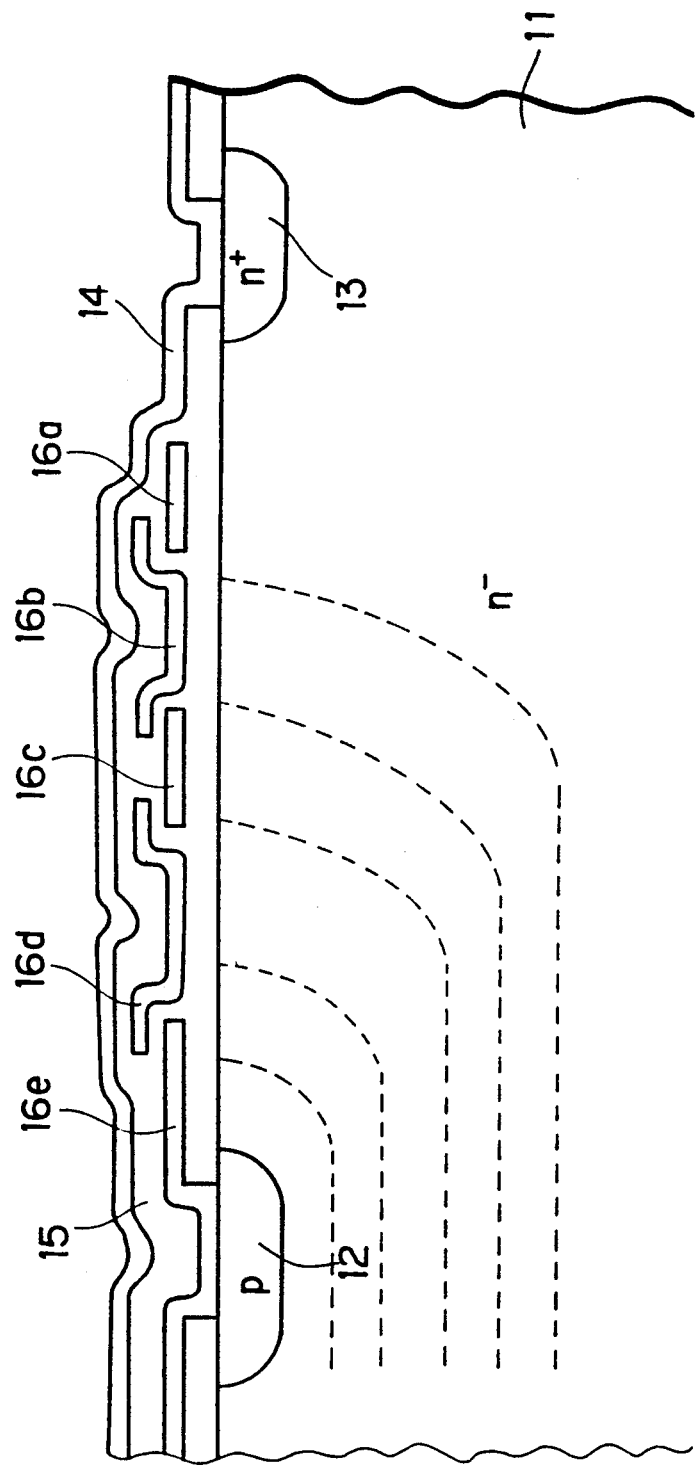
FIG. 2 shows equipotential lines in a depleted region according to the structure of the present invention.

FIGS. 1A and 1B are plan and cross-sectional views showing one preferred embodiment of a structure for preventing electric field concentration in a semiconductor device according to the present invention respectively. A cross-sectional view taken along the line B-B of FIG. 1A corresponds to FIG. 1B.

As shown in FIG. 1B, on the surface of an n⁻ semiconductor substrate 11 are formed a p diffusion region 12 and an n⁺ diffusion region 13 at a distance. The n⁺ diffusion region 13 acts as a region for the electrical bonding of a conductive layer 14 such as wiring and the n⁻ semiconductor substrate 11. The conductive layer 14 is in contact with the n⁺ diffusion region 13 and is insulated from the n⁻ semiconductor substrate 11 and the p diffusion region 12 by an insulating layer 15. In the insulating layer 15 formed immediately under the conductive layer 14, conductive plates 16a–16e are disposed in alignment. The leftmost conductive plate 16e is contacted by the p diffusion region 12, and the other conductive plates 16a–16d are held floatingly in the insulating layer 15. The edges of the adjacent conductive plates overlap each other. For this purpose, both edges of the conductive plates 16b and 16d are bent upward like a stair.

The conductive plates 16a and 16b, 16b and 16c, 16c and 16d, and 16d and 16e are capacitively coupled respectively. The conductive layer 14 and the respective conductive plates 16a–16e are also capacitively coupled. When coupling capacitances between 16a and 16b, 16b and 16c, 16c and 16d, and 16d and 16e are designated by b₁, b₂, b₃ and b₄, respectively, they are set to be in the following relation:

$$b_4 > b_3 > b_2 > b_1 \tag{1}$$

For this purpose, the sizes of the conductive plates 16a–16e are decreased in order from the conductive plate 16e toward the conductive plate 16a and the overlapping areas of the edges of the adjacent conductive plates are decreased in order, as shown in FIG. 1A.

Preferably, the coupling capacitances b₁–b₄ are determined according to the following recurrence formulas:

$$b_1 = \frac{a_1 \cdot V_1}{V_x} \tag{2}$$

-continued $$b_{k+1} = \frac{a_{k+1} \cdot (V_x \cdot k + V_1)}{V_x} + b_k \tag{3}$$

where
- $a_k$: coupling capacitance between the conductive layer 14 and the kth conductive plate 16a–16e from the right;
- $b_k$: coupling capacitance between the kth and (k+1)th conductive plates 16a–16e from the right;
- $V_1$: voltage applied to the capacitance $a_1$ (or potential at the conductive layer 14 with respect to the rightmost conductive plate 16a);
- $V_x$: voltage applied to the capacitance $b_k$ (or potential difference between the adjacent conductive plates 16a–16e).

Preferably, $V_x$ is a constant value indicated by the following formula:

$$V_x = \frac{V_a - V_b - V_1}{n} \tag{4}$$

where
- $V_a$: potential at the conductive layer 14;
- $V_b$: potential at the p diffusion region 12;
- n: number of conductive plates.

The values $a_k$, $V_1$ and $V_x$ are determined previously at the stage of design and the recurrence formulas (2) and (3) are solved, thereby $b_k$ being found. The overlapping area between the adjacent conductive plates 16a–16e is determined so that the found value $b_k$ is achieved.

When the structure for preventing electric field concentration of FIGS. 1A and 1B is constructed according to the formulas (2)–(4), the potential differences between the adjacent conductive plates 16a–16e are uniform due to the requirement of the formula (4). That is, when the potential at the p diffusion region 12 is low and the potential at the n⁺ diffusion region 13 (or the conductive layer 14) is high, the potentials at the conductive plates 16a–16e ascend linearly from the potential at the p diffusion region 12 (low) toward the potential at the conductive layer 14 (high) in order from the conductive plates 16e toward 16a. Accordingly, the surface potential of the n⁻ semiconductor substrate 11 formed under the conductive plates 16a–16e corresponds to the potentials at the conductive plates 16a–16e. The depletion layer extending from the pn junction interface of the n⁻ semiconductor substrate 11 and the p diffusion region 12 is not concentrated leftward (in the direction of the p diffusion region 12) on the surface of the n⁻ semiconductor substrate 11 but can extend rightward (in the direction of the n⁺ diffusion region 13) uniformly. Dotted lines in FIG. 2 indicate equipotential lines in the depleted region of the n⁻ semiconductor substrate 11. Thus, the electric field concentration on the surface of the n⁻ semiconductor substrate 11 can be prevented effectively.

Figure 3:
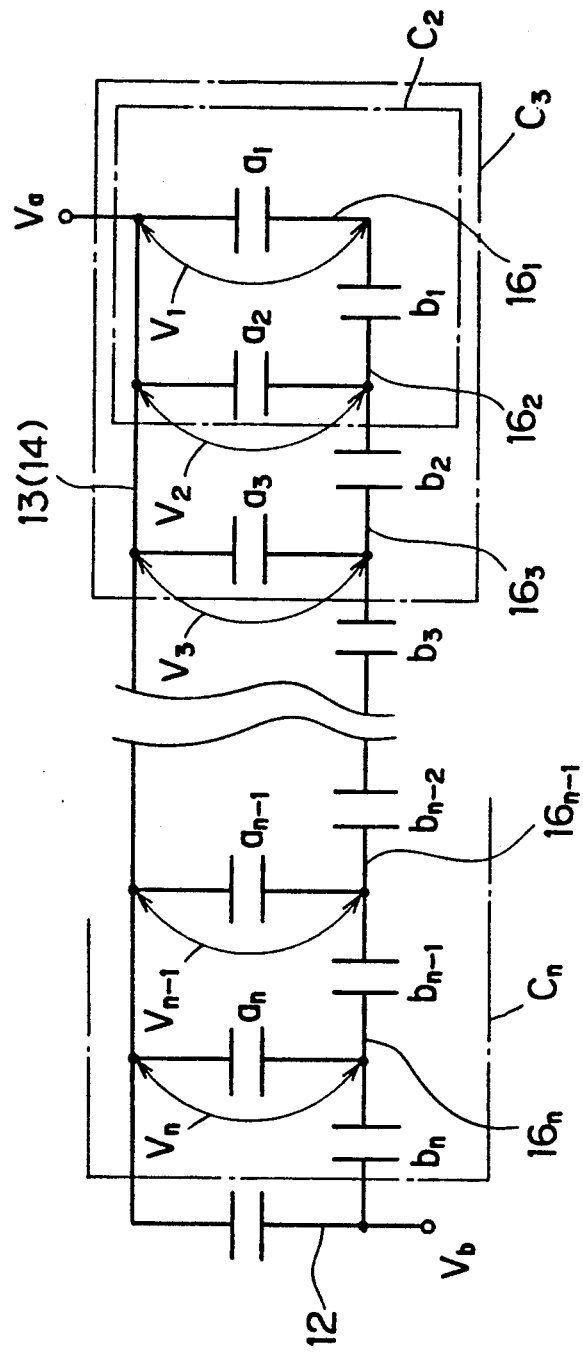
FIG. 3 is a circuit diagram showing an equivalent circuit according to the structure of the present invention.

Hereinafter described is how the above-mentioned recurrence formulas (2) and (3) are derived. FIG. 3 is a circuit diagram showing an equivalent circuit of the structure shown in FIGS. 1A and 1B. In FIG. 3, it is supposed that there are n-number of conductive plates. Numbers 16₁, 16₂, 16₃, ..., 16ₙ₋₁, 16ₙ are assigned to the conductive plates in order of approximation to the n⁺ diffusion region 13. The character $a_k$ (k=1 to n) designates a capacitance between the conductive layer 14 and the conductive plate $16_k$, $b_k$ designates a capacitance between the adjacent conductive plates $16_k$ and $16_{k+1}$, $b_n$ designates a capacitance between the conductive plate $16_n$ and the p diffusion region 12, $V_a$ designates a potential at the n+ diffusion region 13 and the conductive layer 14, $V_b$ designates a potential at the p diffusion region 12, $V_k$ designates a potential difference applied to the capacitance $a_k$ or a potential at the conductive layer 14 with respect to the conductive plate $16_k$, $C_k$ designates a resultant capacitance at the portions surrounded by alternate long and short dash lines. The capacitances between the conductive layer 14, the conductive plate 16 and the n− semiconductor substrate 11 can be substantially disregarded because of the depletion in the vicinity of the surface of the n− semiconductor substrate 11 while the voltage is held.

From the relation of the resultant capacitance, the following equations are obtained:

$$C_1 = a_1 \tag{5}$$

$$C_{k+1} = a_{k+1} + \frac{C_k \cdot b_k}{C_k + b_k} \tag{6}$$

From the principle of conservation of charge, the following equation is obtained:

$$C_k \cdot V_k = b_k \cdot (V_{k+1} - V_k) \tag{7}$$

From Equation (7), $$V_{k+1} - V_k = C_k \cdot V_k / b_k \tag{8}$$

is obtained.
Here, $$C_k \cdot V_k / b_k = (V_a - V_b - V_1)/n \tag{9}$$
$$= V_x \, (= \text{const.})$$

is set. That is, the potential differences between the adjacent conductive plates $16_k$ and $16_{k+1}$ are set constant. From the sum of arithmetical progression, $$V_k = V_x \cdot (k-1) + V_1 \tag{10}$$

is obtained.
Substitution of Equation (10) into Equation (7) gives $$C_k = \frac{b_k \cdot V_x}{V_x \cdot (k-1) + V_1} \tag{11}$$

If $k = k+1$ is substituted into Equation (11), $$C_{k+1} = \frac{b_{k+1} \cdot V_x}{V_x \cdot k + V_1} \tag{12}$$

is obtained.
By substituting Equations (11) and (12) into Equation (6) and solving for $b_{k+1}$, $$b_{k+1} = \frac{a_{k+1} \cdot (V_x \cdot k + V_1)}{V_x} + b_k \tag{13}$$

is obtained. Equation (13) is equal to aforesaid Equation (3).

From Equations (5) and (9), $$b_1 = \frac{C_1 \cdot V_1}{V_x} = \frac{a_1 \cdot V_1}{V_x} \tag{14}$$

is obtained. Equation (14) is equal to aforesaid Equation (2).

If $a_k$ (k=1 to n) is known, $b_k$ (k=1 to n) is found by solving the recurrence formulas (13) and (14) for a selected value $V_1$. When the conductive layer 14 and the conductive plate 16 are designed in accordance with the value $b_k$, the electric field concentration on the surface of the n− semiconductor substrate 1 can be prevented effectively.

According to Equation (13), it is found that the capacitance $b_k$ between the adjacent conductive plates $16_k$ and $16_{k+1}$ is required to increase as k increases (or a distance from the p diffusion region 12 decreases). In other words, in the structure of FIG. 1B, it is the requirement for optimally forming the structure for preventing electric field concentration by the use of the insulating layer 15 having a common thickness to decrease the capacitance between the adjacent conductive plates 16a–16e as a distance from the p diffusion region 12 increases as indicated by Equation (1).

FIG. 4A is a plan view showing another preferred embodiment of the structure for preventing electric field concentration according to the present invention, and FIG. 4B is a cross-sectional view showing a cross-sectional structure taken along the line B—B of FIG. 4A. In this preferred embodiment, floating p diffusion regions 17b and 17d are used instead of the conductive plates 16b and 16d of FIGS. 1A and 1B. The floating p diffusion regions 17b and 17d are formed on the surface of the n− semiconductor substrate 11 corresponding to the portions between the conductive plates 16a and 16c and between 16c and 16e. The edges of the adjacent conductive plates 16a, 16c, 16e and floating p diffusion regions 17b, 17d overlap each other. Thus, by virtue of the coupling capacitances between the conductive plates 16a, 16c, 16e and the floating p diffusion regions 17b, 17d, the potentials thereat can be fixed similarly to the preferred embodiment of FIGS. 1A and 1B, the same effects as mentioned above being available.

Figure 5A:
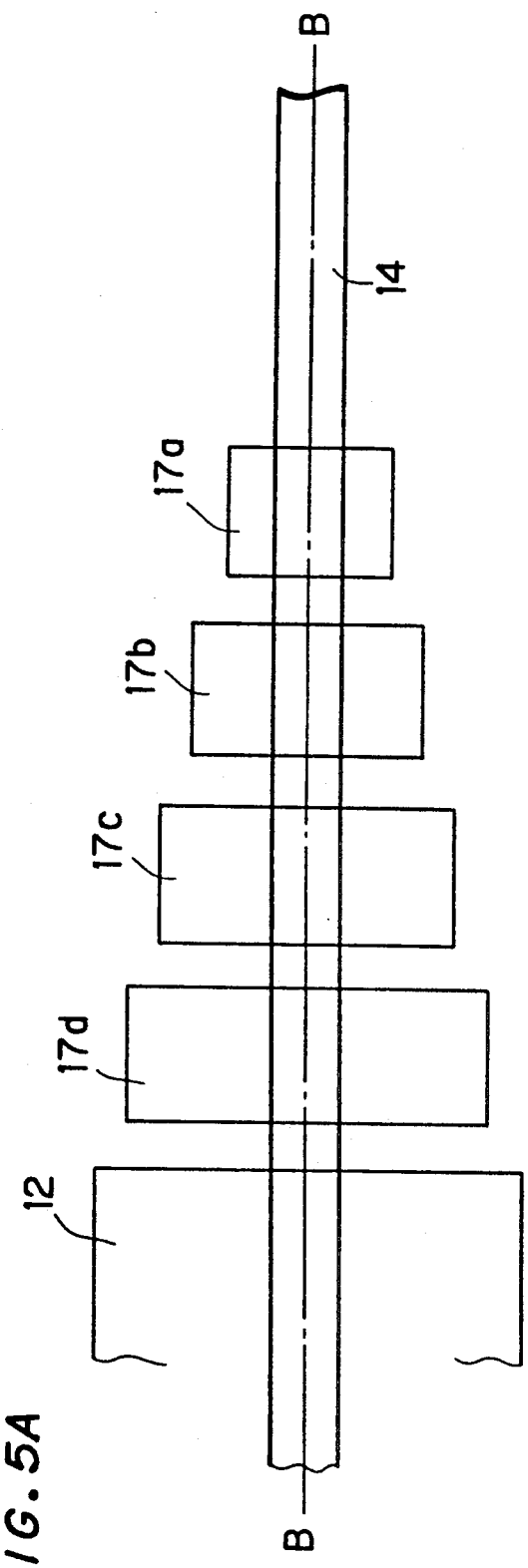
Figure 5B:
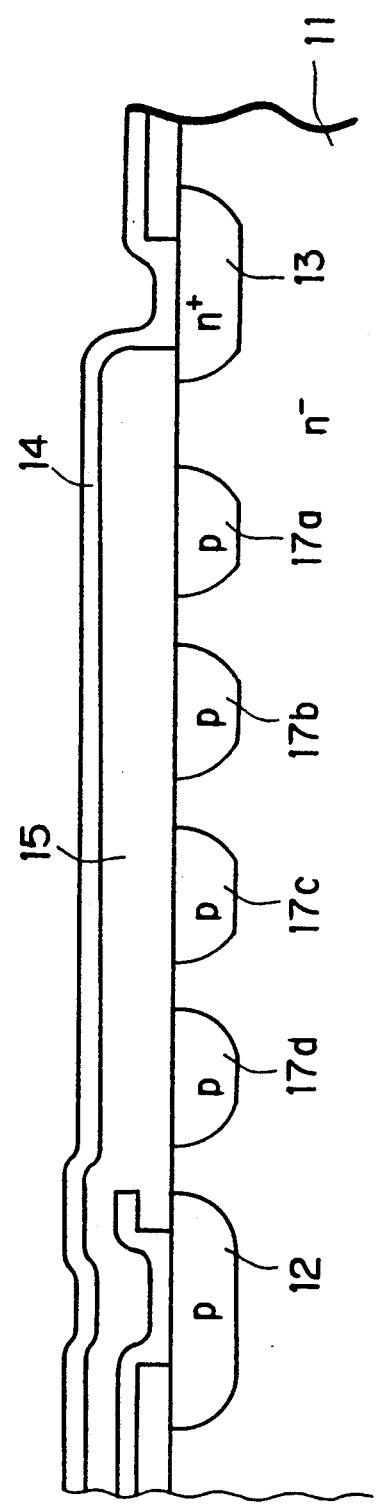
Figure 6A:
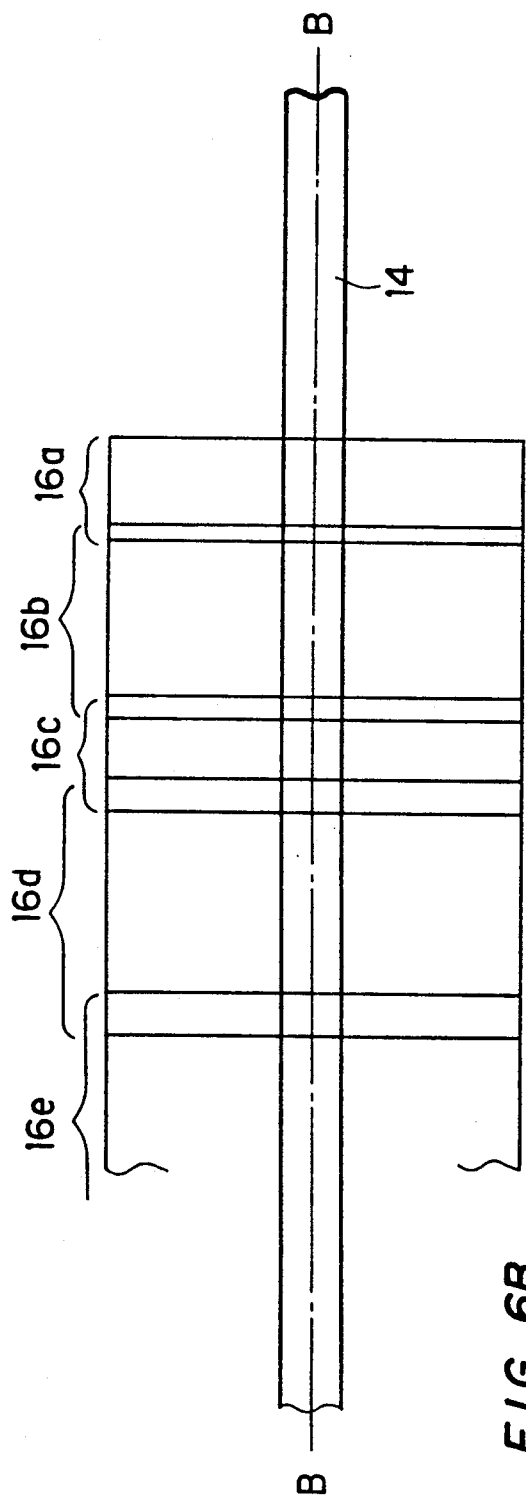
Figure 6B:
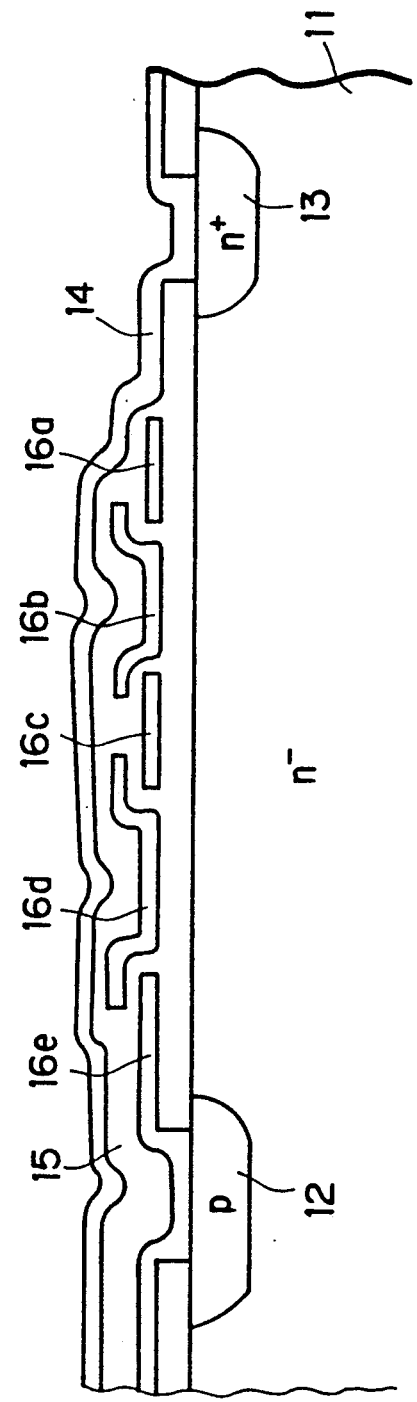
Figures 13A, 13B:
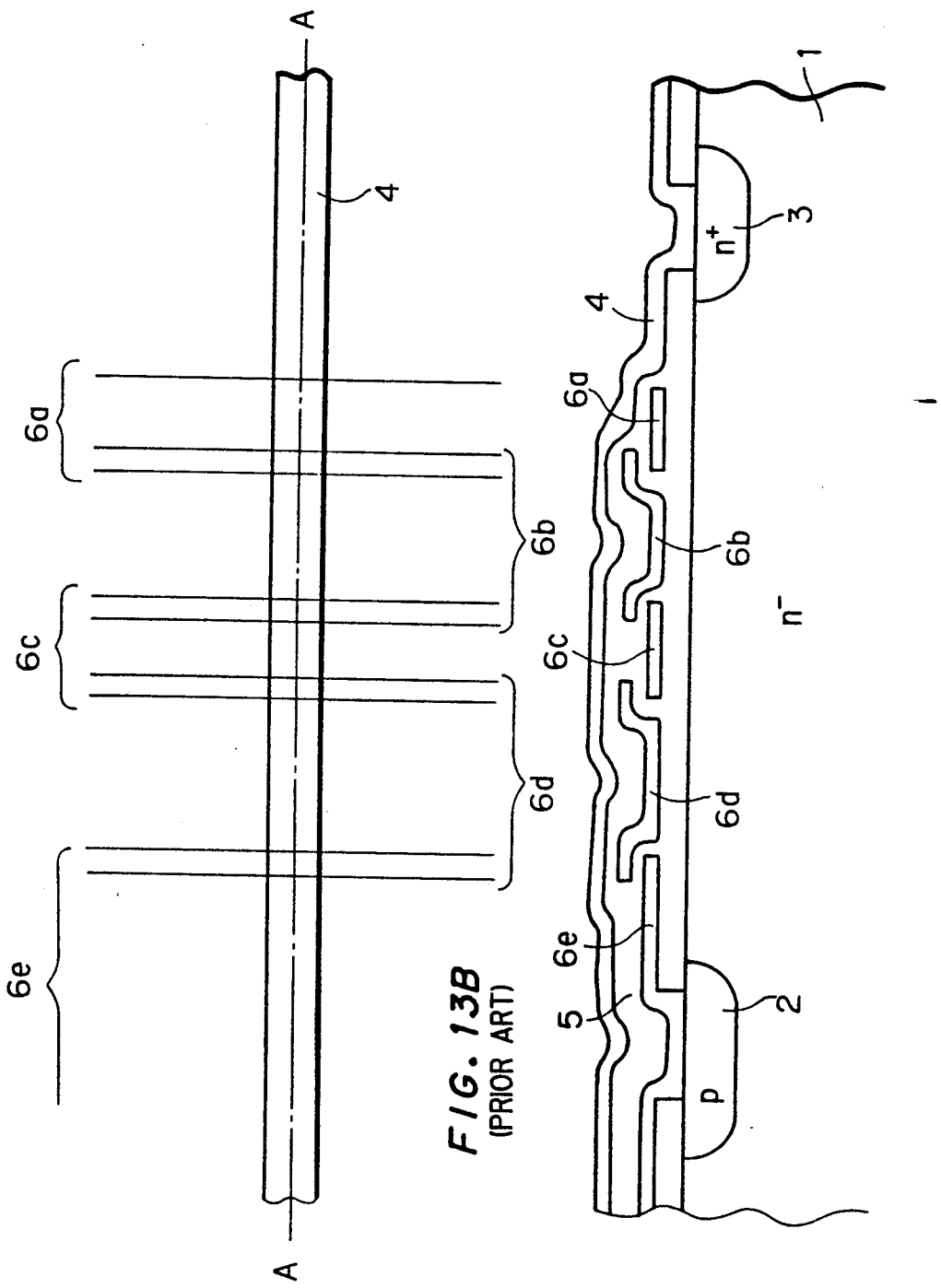
FIGS. 13A and 13B are plan and cross-sectional views showing a conventional structure for preventing electric field concentration.
Figure 14:
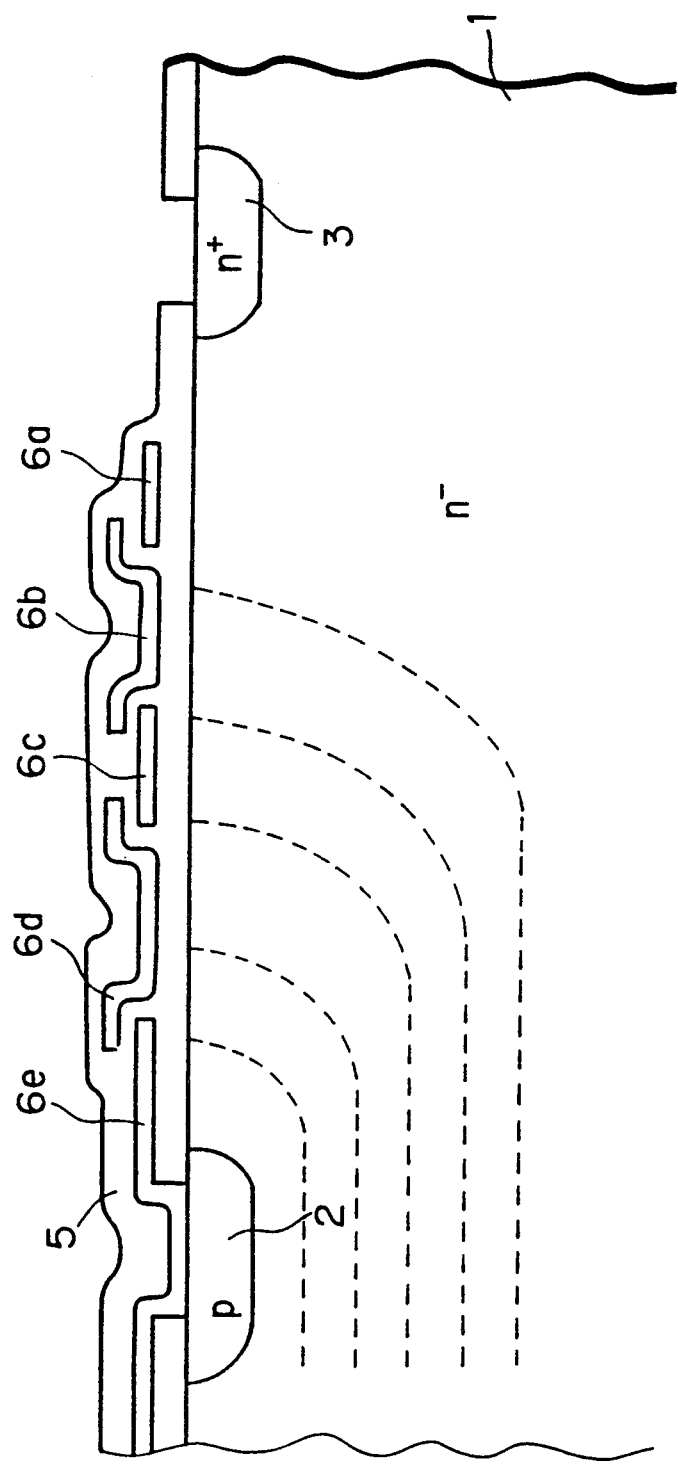
FIG. 14 shows equipotential lines in the depleted region in the case where a conductive layer is absent.
Figure 15:
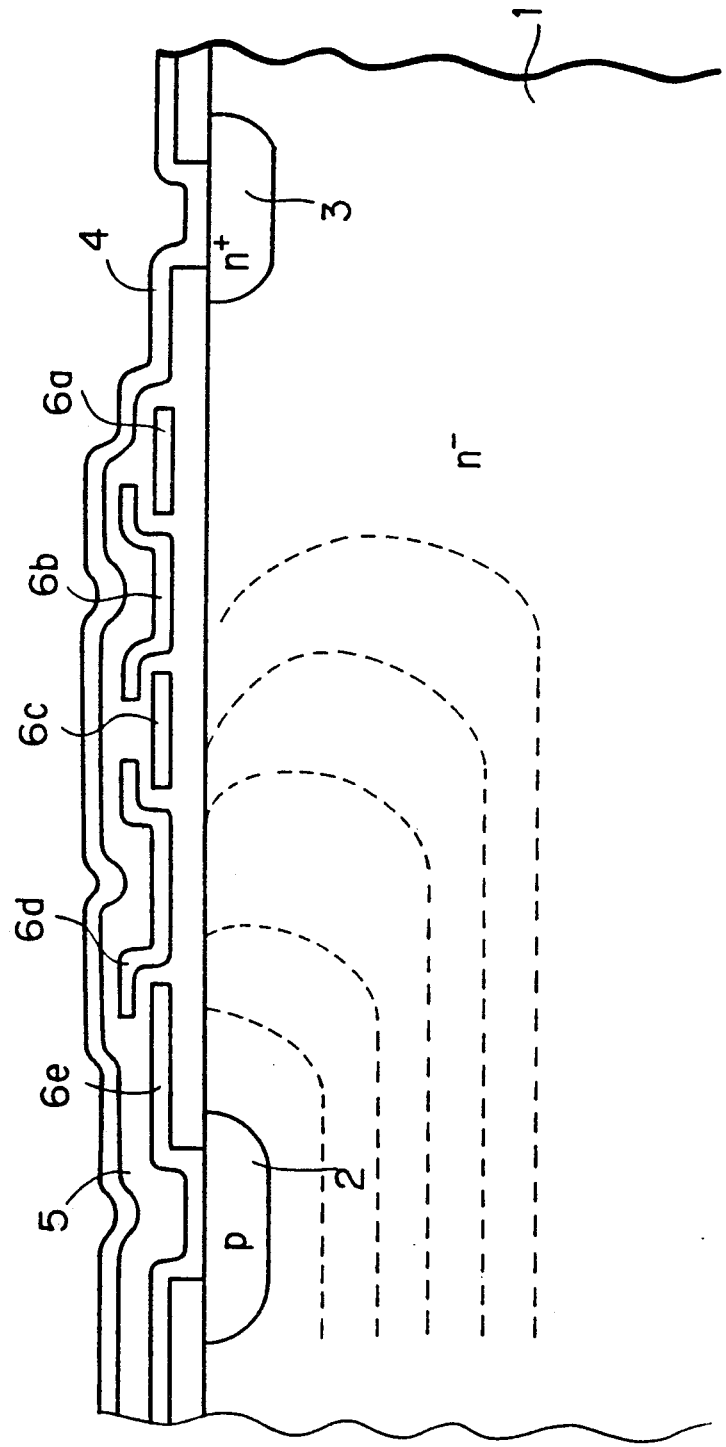
FIG. 15 shows equipotential lines in the depleted region in the case where the conductive layer is present.

FIG. 5A is a plan view showing still another preferred embodiment of the structure for preventing electric field concentration according to the present invention, and FIG. 5B is a cross-sectional view showing a cross-sectional structure taken along the line B—B of FIG. 5A. In this preferred embodiment, floating p diffusion regions 17a–17d are used instead of the conductive plates 16a–16e of FIGS. 1A and 1B. The floating p diffusion regions 17d–17a are spaced in alignment at relatively short intervals from the vicinity of the p diffusion region 12 toward the n+ diffusion region 13 on the surface of the n− semiconductor substrate 11 formed under the conductive layer 14. The floating p diffusion regions 17d–17a are formed in sizes decreasing in order. Accordingly, the coupling capacitance between the adjacent floating p diffusion regions decreases as a distance from the p diffusion region 12 increases. Thus, the potentials at the floating p diffusion regions 17a–17d can be fixed similarly to the conductive plates 16a–16e of the preferred embodiment of FIGS. 1A and 1B, the same effect as described above being achieved.

In the preferred embodiments of FIGS. 1A and 1B and FIGS. 4A and 4B, in order to decrease the coupling capacitances gradually, the sizes of the conductive plates 16e-16a and the floating p diffusion regions 17d, 17b are decreased gradually, thereby the overlapping areas are decreased gradually. As shown in FIGS. 6A and 6B or FIGS. 7A and 7B, the overlapping areas may be decreased gradually by decreasing the overlapping widths thereof gradually while the sizes of the conductive plates 16e-16a and the floating p diffusion regions 17d, 17b are the same.

In the above respective preferred embodiments explained is the case where the conductive layer 14 is in contact with the n+ diffusion region 13 to which a high voltage is applied. However, the conductive layer 14 may be in contact with the p diffusion region 12 to which a low voltage is applied as shown in the preferred embodiments of FIGS. 8A and 8B through FIGS. 12A and 12B. These preferred embodiments correspond to the preferred embodiments of FIGS. 1A and 1B, and FIGS. 4A and 4B through FIGS. 7A and 7B. In each of these preferred embodiments, the electric field from the conductive layer 14 operates to extend unnecessarily rightward (in the n+ diffusion region 13 direction) the depletion layer which extends from the pn junction interface of the n− semiconductor substrate 11 and the p diffusion region 12, on the surface of the n− semiconductor substrate 11. However, because of the presence of the conductive plates 16a-16e and floating p diffusion regions 17a-17d in which the potentials are fixed at equal potential differences, the extension of the depletion layer on the surface of the n− semiconductor substrate 11 is restrained suitably. As a result, for example, at the edges or corners of the n+ diffusion region 13, the electric field concentration and the deterioration of the breakdown voltage can be prevented.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A structure for preventing electric field concentration in a semiconductor device, comprising:
    a first conductive type semiconductor layer;
    a second conductive type first semiconductor region formed on the surface of said semiconductor layer;
    a first conductive type second semiconductor region formed on the surface of said semiconductor layer in isolation from said first semiconductor region;
    a conductive layer in contact with the surface of said second semiconductor region, provided extendedly over said first semiconductor region;
    an insulating layer formed between said conductive layer and said semiconductor layer as well as said first semiconductor region; and
    a plurality of conductive plates disposed in alignment from a position facing to said first semiconductor region toward said second semiconductor region in said insulating layer just under said conductive layer in a manner that said conductive plates are insulated from each other and ends of adjacent conductive plates are overlapped with each other so that a coupling capacitance between adjacent said conductive plates decreases as a distance from said first semiconductor region increases.

2. A structure in accordance with claim 1, wherein edge portions of adjacent said conductive plates are overlapped each other at a distance in a manner that an overlapping area decrease as the distance from said first semiconductor region increases.

3. A structure in accordance with claim 2, wherein sizes of said conductive plates decrease as the distance from said first semiconductor region increases.

4. A structure in accordance with claim 2, wherein an overlapping width of adjacent said conductive plates decrease as the distance from said first semiconductor region increases.

5. A structure in accordance with claim 1, wherein nearest one of said conductive plates to said first semiconductor region is electrically connected with said first semiconductor region.

6. A structure for preventing electric field concentration in a semiconductor device, comprising:
    a first conductive type semiconductor layer;
    a second conductive type first semiconductor region formed on the surface of said semiconductor layer;
    a first conductive type second semiconductor region formed on the surface of said semiconductor layer in isolation from said first semiconductor region;
    a conductive layer in contact with the surface of said second semiconductor region, provided extendedly over said first semiconductor region;
    an insulating layer formed between said conductive layer and said semiconductor layer as well as said first semiconductor region;
    at least one conductive plate formed in said insulating layer just under said conductive layer in an insulated manner; and
    at least one second conductive type floating semiconductor region formed in said semiconductor layer just under said conductive layer,
    said conductive plate and said floating semiconductor region being disposed in alignment alternately from the vicinity of said first semiconductor region toward said second semiconductor region in a manner that ends of said conductive plate and said floating semiconductor region which are adjacent to each other are overlapped with each other so that a coupling capacitance between said conductive plate and said floating semiconductor region which are adjacent to each other decreases as a distance from said first semiconductor region increases.

7. A structure in accordance with claim 6, wherein edge portions of adjacent said conductive plate and said floating semiconductor region are overlapped each other at a distance in a manner that an overlapping area decrease as the distance from said first semiconductor region increases.

8. A structure in accordance with claim 7, wherein sizes of said conductive plate and said floating semiconductor region decrease as the distance from said first semiconductor region increases.

9. A structure in accordance with claim 9, wherein an overlapping width of adjacent said conductive plate and said floating semiconductor region decrease as the distance from said first semiconductor region increases.

10. A structure in accordance with claim 8, wherein nearest one of said conductive plates to said first semiconductor region is electrically connected with said first semiconductor region.

11. A structure for preventing electric field concentration in a semiconductor device, comprising:
    a first conductive type semiconductor layer;

a second conductive type first semiconductor region formed on the surface of said semiconductor layer;

a first conductive type second semiconductor region formed on the surface of said semiconductor layer in isolation from said first semiconductor region;

a conductive layer in contact with the surface of said first semiconductor region, provided extendedly over said second semiconductor region;

an insulating layer formed between said conductive layer and said semiconductor layer as well as said second semiconductor region; and a plurality of conductive plates disposed in alignment from a position facing to said second semiconductor region toward said first semiconductor region in said insulating layer just under said conductive layer in a manner that said conductive plates are insulated from each other and ends of adjacent conductive plates are overlapped with each other so that a coupling capacitance between adjacent said conductive plates decreases as a distance from said second semiconductor region increases.

12. A structure in accordance with claim 11, wherein edge portions of adjacent said conductive plates are overlapped each other at a distance in a manner that an overlapping area decrease as the distance from said second semiconductor region increases.

13. A structure in accordance with claim 12, wherein sizes of said conductive plates decrease as the distance from said second semiconductor region increases.

14. A structure in accordance with claim 12, wherein an overlapping width of adjacent said conductive plates decrease as the distance from said second semiconductor region increases.

15. A structure in accordance with claim 11, wherein nearest one of said conductive plates to said second semiconductor region is electrically connected with second semiconductor region.

16. A structure for preventing electric field concentration in a semiconductor device, comprising:

a first conductive type semiconductor layer;

a second conductive type first semiconductor region formed on the surface of said semiconductor layer;

a first conductive type second semiconductor region formed on the surface of said semiconductor layer in isolation from said first semiconductor region;

a conductive layer in contact with the surface of said first semiconductor region, provided extendedly over said second semiconductor region;

an insulating layer formed between said conductive layer and said semiconductor layer as well as said second semiconductor region;

at least one conductive plate formed in said insulating layer just under said conductive layer in an insulating manner; and at least one second conductive type floating semiconductor region formed in said semiconductor layer just under said conductive layer, said conductive plate and said floating semiconductor region being disposed in alignment alternately from the vicinity of said second semiconductor region toward said first semiconductor region in a manner that ends of said conductive plate and said floating semiconductor region which are adjacent to each other are overlapped with each other so that a coupling capacitance between said conductive layer and said floating semiconductor region which are adjacent to each other decreases as a distance from said second semiconductor region increases.

17. A structure in accordance with claim 16, wherein edge portions of adjacent said conductive plate and said floating semiconductor region are overlapped each other at a distance in a manner that an overlapping area decrease as the distance from said second semiconductor region increases.

18. A structure in accordance with claim 17, wherein sizes of said conductive plate and said floating semiconductor region decrease as the distance from said second semiconductor region increases.

19. A structure in accordance with claim 17, wherein an overlapping width of adjacent said conductive plate and said floating semiconductor region decrease as the distance from said second semiconductor region increases.

20. A structure in accordance with claim 16, wherein nearest one of said conductive plates to said second semiconductor region is electrically connected with said second semiconductor region.

* * * * *